United States Patent [19]

Kim et al.

[11] Patent Number: 5,283,764
[45] Date of Patent: Feb. 1, 1994

[54] REFRESH TIMER FOR PROVIDING A CONSTANT REFRESH TIMER REGARDLESS OF VARIATIONS IN THE OPERATING VOLTAGE

[75] Inventors: Myong-Jae Kim; Jei-Hwan You, both of Suwon, Rep. of Korea

[73] Assignee: Samsung Electronics, Co., Ltd., Suwon, Rep. of Korea

[21] Appl. No.: 990,914

[22] Filed: Dec. 15, 1992

[30] Foreign Application Priority Data

Dec. 18, 1991 [KR] Rep. of Korea ............... 1992-23343

[51] Int. Cl.$^5$ ............................................. G11C 7/00
[52] U.S. Cl. ............................. 365/222; 365/189.01
[58] Field of Search ................. 365/222, 189.01; 331/49, 175

[56] References Cited

U.S. PATENT DOCUMENTS 5,150,329 9/1992 Hoshi ........................... 365/189.01

Primary Examiner—Eugene R. LaRoche
Assistant Examiner—Frank Niranjan
Attorney, Agent, or Firm—Robert A. Westerlund; Charles R. Donohoe

[57] ABSTRACT

A refresh timer suitable for use in a semiconductor memory device which has a refresh mode of operation which is enabled by a refresh enable clock signal, and which utilizes an operating voltage having a plurality of different operating levels, Vi, where $i = 1 - n$, and n is an integer equal to or greater than two. The refresh timer includes a first circuit responsive to the operating voltage for generating a plurality of output voltage signals corresponding to the plurality of different operating voltage levels, respectively. The first circuit includes a plurality of individual voltage detection circuits corresponding to the plurality of different operating voltage levels, respectively, with each ith one of the voltage detection circuits being adapted to detect whether the operating voltage is at the corresponding ith level, and to drive the corresponding ith one of the output voltage signals high when it is detected that the operating voltage is at the corresponding ith level. The refresh timer also includes additional circuitry responsive to the refresh enable clock signal and the ith one of the output voltage signals which was last driven high by the first circuit, for generating a refresh cycle time control signal having a constant period, regardless of the level of the operating voltage.

20 Claims, 8 Drawing Sheets

REFRESH TIMER FOR PROVIDING A CONSTANT REFRESH TIMER REGARDLESS OF VARIATIONS IN THE OPERATING VOLTAGE

BACKGROUND OF THE INVENTION

The present invention relates generally to semiconductor memory devices, and more particularly, to a novel refresh timer for controlling the data retention mode thereof, in response to a number of different operating voltages.

In semiconductor memory devices such as dynamic random access memories (DRAMS) and pseudo DRAMS, a data retention mode of operation is required in order to prevent the loss of data stored in the storage capacitor of each memory cell due to leakage of the storage capacitor and due to leakage current of the substrate over relatively short time intervals. The data retention mode consists of a back bias voltage generating operation for preventing the loss of data due to leakage current of the substrate, and a refresh operation for preventing the loss of data due to leakage of the storage capacitor of each memory cell. The back bias voltage generating operation is performed by applying a back bias voltage to the substrate. The refresh operation is performed by periodically refreshing the data stored in each memory cell. The time period between successive refresh operations is preferably constant, and is commonly referred to as the refresh cycle time.

In general, it is desired to make the refresh cycle time as long as possible in order to reduce current consumption, while simultaneously minimizing the loss of data due to capacitor leakage. It has become increasingly possible to extend the refresh cycle time due to the advent of high integration density DRAMs which use relatively low level external supply voltages. Further, it is desired to make the refresh cycle time as precisely uniform as possible, in order to ensure the accuracy, stability, and reliability of the refresh operation. However, when DRAMs are employed in notebook computers and the like which utilize a battery as a primary or secondary voltage source, it has been deemed advantageous to use at least two separate operating voltages, in order to extend the useful life of the battery and to minimize the likelihood that a system malfunction will occur. In this connection, notebook computers typically employ a battery to supply an initial external supply voltage of 5 V, and then, when a low voltage level condition is detected (e.g., when the battery supply voltage drops below 5 V for a given period of time) due to discharge of the battery during use, the operating voltage is switched to 3.3 V. The transition from a higher operating voltage to a lower operating voltage causes a problem in that the refresh timer currently used in such devices generates a refresh timing signal having a frequency which varies depending upon the level of the operating voltage. Thus, when the operating voltage is switched from the 5 V level to the 3.3 V level, the refresh cycle time is increased, thereby rendering the refresh cycle time non-uniform (i.e., non-constant) between the two operating voltage modes. In this connection, a functional block diagram of a conventional refresh timer is depicted in FIG. 1, and is described below.

More particularly, with reference to FIG. 1, the conventional refresh timer includes a ring oscillator 1 and a counter stage 2, which are operated by a refresh timer enable clock signal $\phi/RFH$. The signal $\phi/RFH$ goes high in response to a column address strobe signal /CAS (not shown) going high before a row address strobe signal /RAS (not shown) goes high, which condition signifies that a refresh cycle is to be performed. In response to the $\phi/RFH$ signal going high, the ring oscillator 1 generates a pulse $\phi OSC$ having a period of a few microseconds ($\mu s$). Because the period of the pulse $\phi OSC$ is less than the desired refresh cycle time, it is fed to a counter stage 2 which functions to extend the length of the pulse. In this connection, the output Qi of the counter stage 2 is a pulse having a period equal to the desired refresh cycle time.

With reference now to FIG. 2, there can be seen a chart illustrating the period of the output signal $\phi OSC$ of the ring oscillator 1 as a function of the operating voltage level. As can be readily appreciated, the output signal $\phi OSC$ of the ring oscillator 1 has a period which differs dependent upon the level of the operating voltage. For example, when the operating voltage is 3.0 V, the period of $\phi OSC$ is approximately 2.2 $\mu s$, and when the operating voltage is 4.0 V, the period of $\phi OSC$ is approximately 1.1 $\mu s$. Consequently, the refresh cycle time undesirably varies in response to fluctuations and variations of the operating voltage, thereby degrading the reliability, stability, and accuracy of the refresh operation.

Thus, as is evident from the foregoing, there presently exists a need for a refresh timer which eliminates the above-described drawbacks and shortcomings of presently available refresh timers. The present invention fulfills this need.

SUMMARY OF THE INVENTION

The present invention encompasses a refresh timer suitable for use in a semiconductor memory device which has a refresh mode of operation which is enabled by a refresh enable clock signal, and which utilizes an operating voltage having a plurality of different operating levels, Vi, where i=1−n, and n is an integer equal to or greater than two. The refresh timer includes a first circuit responsive to the operating voltage for generating a plurality of output voltage signals corresponding to the plurality of different operating voltage levels, respectively. The first circuit includes a plurality of individual voltage detection circuits corresponding to the plurality of different operating voltage levels, respectively, with each ith one of the voltage detection circuits being adapted to detect whether the operating voltage is at the corresponding ith level, and to drive the corresponding ith one of the output voltage signals high when it is detected that the operating voltage is at the corresponding ith level. The refresh timer also includes additional circuitry responsive to the refresh enable clock signal and the ith one of the output voltage signals which was last driven high by the first circuit, for generating a refresh cycle time control signal having a constant period, regardless of the level of the operating voltage.

In a first preferred embodiment of the refresh timer of the present invention, the additional circuitry includes a second circuit responsive to the refresh enable clock signal and the plurality of output voltage signals, for generating a plurality of output control signals corresponding to the plurality of output voltage signals, respectively. The second circuit includes logic gating circuitry for driving high only the ith one of the output control signals corresponding to the ith one of the output voltage signals which was last driven high by the first circuit. The additional circuitry also includes a plurality of individual oscillator circuits, each of which is adapted to receive a corresponding ith one of the output control signals from the second circuit, whereby only the oscillator circuit which receives the one of the output control signals which is in a high state is enabled, to thereby produce an oscillator clock signal, wherein regardless of which one of the individual oscillator circuits is enabled, the oscillator clock signal produced thereby will have the same, constant period. The additional circuitry further includes circuitry, e.g., a counter stage, for extending the length of the period of the oscillator clock signal, to thereby produce the refresh cycle time control signal.

In a second preferred embodiment of the refresh timer 2 of the present invention, the additional circuitry includes an oscillator responsive to the refresh enable clock signal for generating an oscillator output signal having a period which is inversely proportional to the level of the operating voltage, by a predetermined ratio. The additional circuitry further includes pulse extending circuitry, e.g., a multi-stage counter, responsive to the refresh enable clock signal and the oscillator output signal for generating a plurality of output pulse signals, wherein each successive output pulse signal has a period which is greater than the period of the preceding output pulse signal by the predetermined ratio. The additional circuitry also includes a second circuit responsive to the refresh enable clock signal and the plurality of output pulse signals from the pulse extending circuitry to generate the refresh cycle time control signal having a constant period.

BRIEF DESCRIPTION OF THE DRAWINGS

These and various other features and advantages of the present invention will be readily understood with reference to the following detailed description taken in conjunction with the accompanying drawings, wherein like reference numerals designate like structural elements, and, in which.

DETAILED DESCRIPTION OF THE INVENTION

Figure 3:
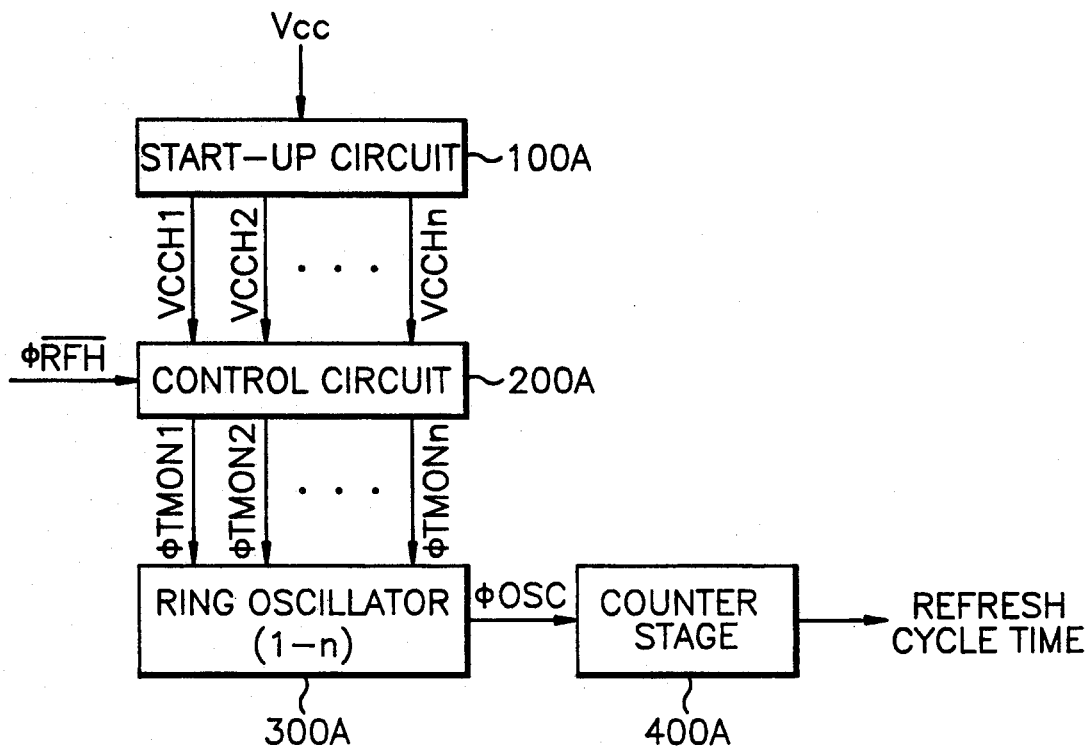
FIG. 3 is a functional block diagram illustrating a refresh timer constructed in accordance with a first preferred embodiment of the present invention.

With reference now to FIG. 3, there can be seen a functional block diagram of a refresh timer constructed in accordance with a first preferred embodiment of the present invention. The refresh timer includes a start-up circuit 100A, a control circuit 200A, a ring oscillator 300A, and a counter stage 400A, which cooperatively function in a manner described below to produce a refresh cycle time control signal for synchronizing the refresh operation of a DRAM (not shown) or pseudo-DRAM memory device (not shown), or the like.

More particularly, with continuing reference to FIG. 3, the start-up circuit 100A receives an external supply or operating voltage Vcc, and, in response thereto, generates a plurality (two or more) of output signals VCCH1-VCCHn, where $n \geq 2$, and n = the number of different operating voltage levels employed in the memory device. As will be more fully developed hereinafter, one or more of the output signals VCCH1-VCCHn are driven high, depending upon the level of the external operating voltage Vcc. The control circuit 200A receives the output signals VCCH1-VCCHn from the start-up circuit 100A, and, in response to a refresh enable clock signal $\phi$/RFH going low, generates a corresponding plurality of output signals $\phi$TMON1-$\phi$TMONn. As will also be more fully developed hereinafter, only the one of the control circuit output signals $\phi$TMON1-$\phi$TMONn corresponding to the one of the start-up circuit output signals VCCH1-VCCHn which went high last, is driven high. For example, if only the output signal VCCH1 of the start-up circuit 100A is high, then only the corresponding output signal $\phi$TMON1 of the control circuit 200A will be driven high.

The output signals $\phi$TMON1-$\phi$TMON2 of the control circuit 200A are supplied to the ring oscillator 300A. The ring oscillator 300A is comprised of a plurality n of individual ring oscillators (1−n). As will also be fully developed hereinafter, only the output $\phi$osc of the individual ring oscillator 1−n corresponding to the one of the control circuit output signals $\phi$TMON1-$\phi$TMONn which is high, is coupled to the counter stage 400A. For example, if the control circuit output signal $\phi$TMONn is high, then only the output $\phi$osc of the corresponding individual ring oscillator n of the ring oscillator 300A will be coupled to the counter stage 400A. However, regardless of which individual ring oscillator 1−n is selected, the output $\phi$osc of the ring oscillator 300A will be the same. Thus, it will be appreciated that the frequency or period of the output $\phi$osc of the ring oscillator 300A is constant, regardless of the level of the operating voltage Vcc. The counter stage 400A functions in the normal manner to extend the period of the output $\phi$osc of the ring oscillator 300A, and thereby produce a refresh cycle time control signal (labelled "REFRESH CYCLE TIME") having the desired period. Therefore, it will be appreciated that the refresh cycle time will be constant regardless of variations or fluctuations in the level of the operating voltage Vcc.

Figure 4:
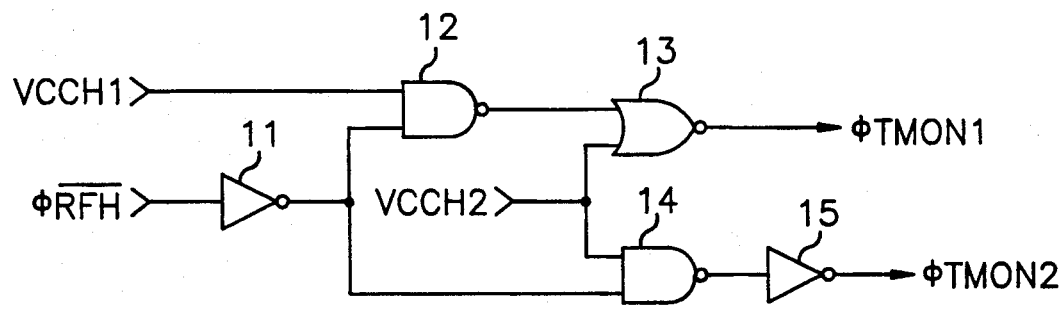
FIG. 4 is a schematic diagram of the control circuit 100A of the refresh timer depicted in FIG. 3.

With reference now to FIG. 4, there can be seen a schematic diagram of an exemplary embodiment of the control circuit 200A wherein n is chosen to be 2. It should be clearly understood that, of course, n can alternatively be chosen to be any number greater than two. As shown, the control circuit 200A includes a first NAND gate 12 which receives a first output signal VCCH1 of the start-up circuit 100A at one of its inputs, and an inverted version of the refresh enable clock signal $\phi$/RFH, via an inverter 11, at its other input. The control circuit 200A also includes a NOR gate 13 which receives the output of the first NAND gate 12 at one of its inputs, and a second output signal VCCH2 of the start-up circuit 100A at its other input, and, in response thereto, produces an output signal $\phi$TMON1 at its output. The control circuit 200A further includes a second NAND gate 14 which receives the inverted version of the refresh enable clock signal $\phi$/RFH at one of its inputs, and the second output signal VCCH2 of the start-up circuit 100A at its other input. The output of the second NAND gate 14 is inverted by an inverter 15, to thereby produce an output signal $\phi$TMON2.

Figure 5A:
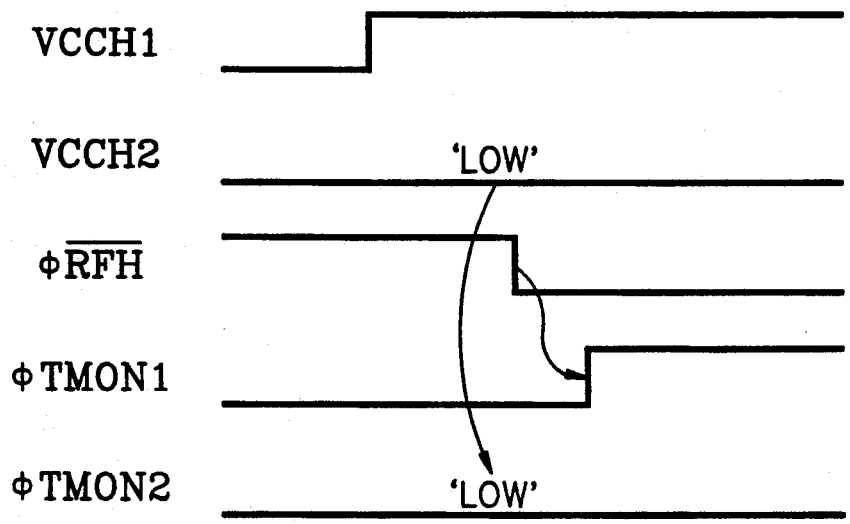
FIG. 5A and 5B are timing diagrams illustrating the resultant waveforms of various signals generated by the refresh timer depicted in FIG. 3, during two different modes of operation thereof, respectively.
Figure 5B:
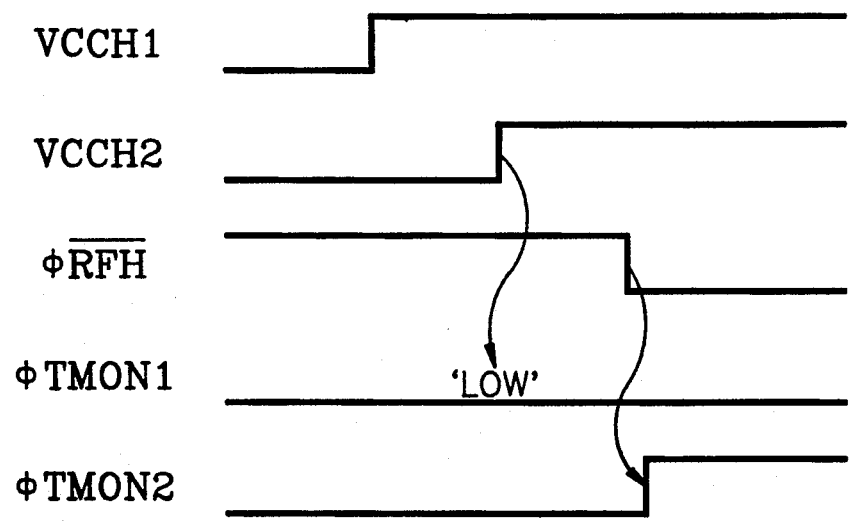

With reference now to FIGS. 5A and 5B, there can be seen waveform diagrams of the signals VCCH1, VCCH2, $\phi$/RFH, $\phi$TMON1 and $\phi$TMON2, illustrating the operation of the control circuit 200A depicted in FIG. 4, during two different modes of operation, respectively.

More particularly, FIG. 5A illustrates the resultant waveforms of the above-mentioned signals in the case wherein the output signal VCCH1 of the start-up circuit 100A is high, and the output signal VCCH2 of the start-up circuit 100A is low, which, in accordance with a preferred embodiment of the present invention, occurs when the operating voltage Vcc is above a first low threshold voltage level, Vt1, e.g., 3 V, but below a second/high threshold voltage level, Vth, e.g., 5 V. For example, when the refresh timer of the present invention is utilized in a notebook computer (not shown) or the like which utilizes a battery (not shown) as a primary or secondary voltage source Vcc, the operating voltage Vcc may drop below the high threshold voltage level, Vth, due to discharge of the battery which occurs during use. In response to detection of this condition, the operating voltage may be switched from a high operating voltage level (e.g., 5 V) to a low operating voltage level (e.g.,3.3 V).

In this mode of operation, the output of the first NAND gate 12 goes low when the refresh enable clock signal $\phi$/RFH goes low, because both inputs, VCCH1 and the inverse of the refresh enable clock signal $\phi$/RFH, to the first NAND gate 12 will, at that time, be high. Further, the output of the NOR gate 13, which is the output signal $\phi$TMON1, will go high, since both inputs thereto, i.e., the output of the first NAND gate 12 and VCCH2, will be low. Also, the output of the second NAND gate 14 will be high, since one of the inputs thereto, i.e., the inverse of the refresh enable clock signal $\phi$/RFH, will be high, while the other input thereto, i.e., VCCH2, will be low. Therefore, the output of the inverter 15, which is the output signal $\phi$TMON2, will be low. Therefore, it can be appreciated that when only the output signal VCCH1 of the start-up circuit 100A is high, only the corresponding output signal $\phi$TMON1 of the control circuit 200A will be high.

With reference now to FIG. 5B, when the operating voltage Vcc is above the high threshold voltage level, Vth, both of the output signals, VCCH1 and VCCH2, of the start-up circuit 100A will be high. In this mode of operation, the output of the second NAND gate 14 will go low, since both inputs thereto, i.e., the inverse of the refresh enable clock signal $\phi$/RFH and VCCH2, will be high. Consequently, the output of the inverter 15, which is the output signal $\phi$TMON2, will go high. Further, since one of the inputs to the NOR gate 13, i.e., VCCH2, will be high, the output of the NOR gate 13, which is the output signal $\phi$TMON1, will necessarily go low. Therefore, it can be appreciated that when both output signals VCCH1 and VCCH2 of the start-up circuit 100A are high, only the output signal $\phi$TMON2 of the control circuit 200A corresponding to the output signal of the start-up circuit 100A which went high last, i.e., VCCH2, will be high.

Figure 6A:
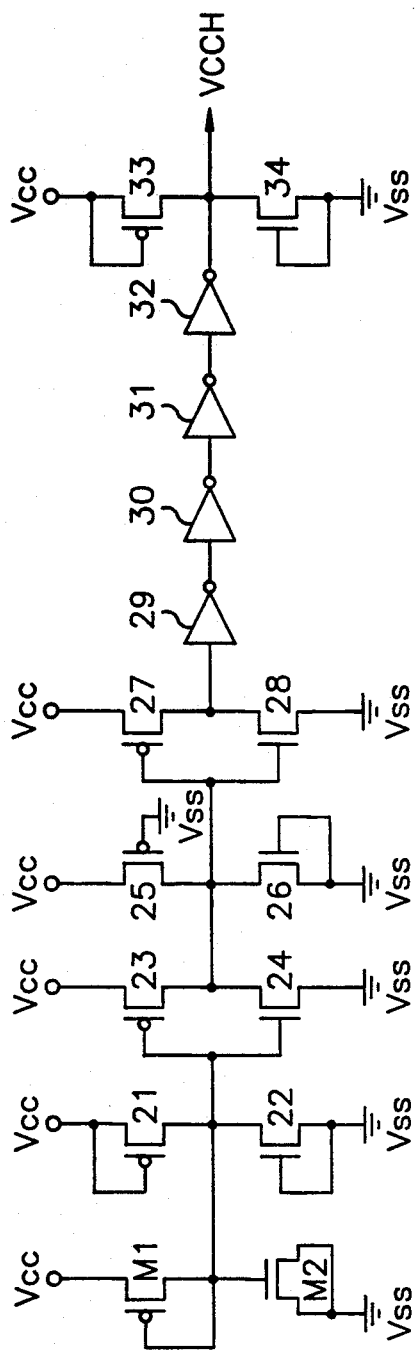
FIG. 6A is a schematic diagram of the start-up circuit of the refresh timer depicted in FIG. 3.

With reference now to FIG. LA, there can be seen a schematic diagram of a preferred embodiment of the start-up circuit 100A depicted in block diagram form in FIG. 3. As will become evident, the start-up circuit 100A shown in FIG. 6A is configured to detect the voltage level of the operating voltage, Vcc, which, as previously mentioned, can suitably be a battery of a notebook computer or the like. Generally, the start-up circuit 100A detects whether the operating voltage Vcc is above or below a predetermined threshold value Vt. When Vcc$\geq$Vt, the output signal VCCH goes high, and when Vcc<Vt, the output signal VCCH goes low.

More particularly, with continuing reference to FIG. 6A, the start-up circuit 100A depicted therein includes a first stage comprised of a resistor-connected PMOS transistor M1 and a capacitor-connected NMOS transistor M2 connected in series between Vcc and a reference voltage Vss, which is shown to be at ground potential. The start-up circuit 100A further includes a first CMOS inverter circuit comprised of PMOS transistor 23 and NMOS transistor 24 connected in series between Vcc and Vss. The common/intermediate node between the transistors M1 and M2 is coupled to the input of the first CMOS inverter circuit. The start-up circuit 100A also includes a driver circuit comprised of a second CMOS inverter circuit comprised of PMOS transistor 27 and NMOS transistor 28 connected in series between Vcc and Vss, and a string of series connected inverters 29-32. The input of the second CMOS inverter circuit is coupled to the output of the first CMOS inverter circuit. The start-up circuit 100A also includes a first float prevention circuit comprised of diode-connected transistors 21 and 22 connected in series between Vcc and Vss. The first float prevention circuit functions to prevent the voltage appearing at the common/intermediate node between the transistors Mi and M2 of the first stage from floating. A second float prevention circuit comprised of the transistors 25 and 26 connected in series between Vcc and Vss, with the gates of both transistors being coupled to Vss, is also provided to prevent the output of the first CMOS inverter circuit from floating. Similarly, a third float prevention circuit comprised of diode-connected transistors 33 and 34 connected in series between Vcc and Vss is also provided to prevent the output of the inverter 32, which is the output signal VCCH, from floating.

Figure 6B:
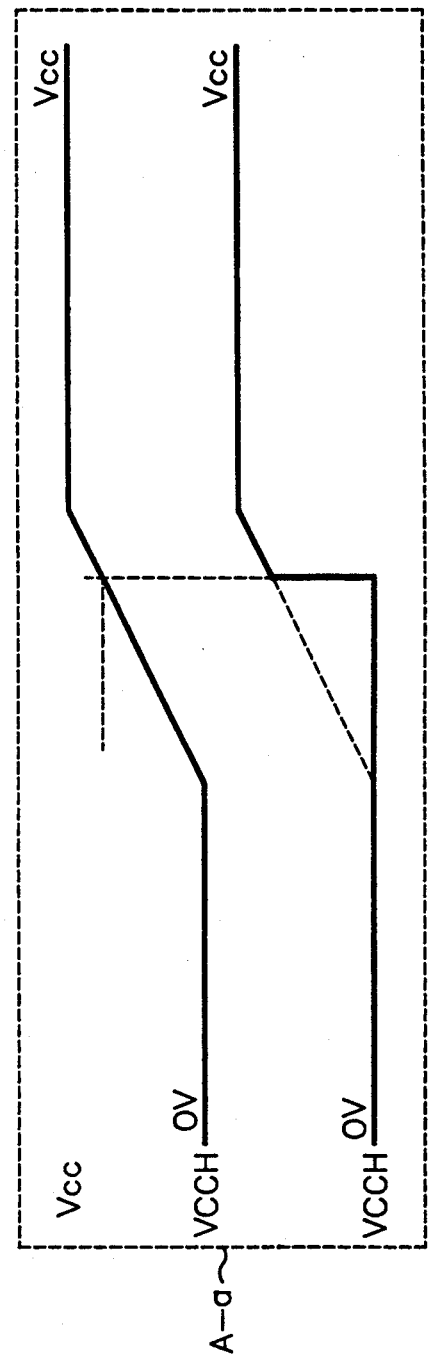
FIG. 6B is a waveform diagram of the start-up circuit of the refresh timer depicted in FIG. 6A.

In operation, the above-described start-up circuit 100A depicted in FIG. 6A works as follows. The transistors M1 and M2 of the first stage thereof function to sense whether the operating voltage Vcc is above or below the predetermined threshold level Vt. More particularly, since the transistor M1 functions as a resistor, and the transistor M2 functions as a capacitor, the RC time constant of the first stage can be set to a predetermined value by appropriately sizing the transistors M1 and M2, in a manner well-known in the pertinent art. In this connection, the RC time constant of the first stage is selected to be a value which causes the first CMOS inverter circuit to be triggered upon the operating voltage Vcc reaching the threshold voltage level Vt, e.g., 5 V. When the first CMOS inverter circuit is triggered, its output goes low. When the output of the first CMOS inverter circuit goes low, the output of the second CMOS inverter circuit goes high, and after a delay of four inverter delay periods, the output of the inverter 32 of the drive circuit, which is the output signal VCCH, goes high, as is shown in block A-a of FIG. 6B. Therefore, as long as the operating voltage is equal to or greater than the threshold Vt, e.g., 5 V, the output signal VCCH of the start-up circuit 100A is "high".

The following discussion serves to further illustrate the above-described operation of the start-up circuit 100A depicted in FIG. 6A. If the resistance of the transistor M1 is made relatively small, the voltage at the common/intermediate node between the transistors M1 and M2 will be quickly raised to a level sufficient to turn on the NMOS transistor 24 of the first CMOS inverter circuit, thereby triggering the operation of the first CMOS inverter circuit to produce a "low" level signal at its output, which will, in turn, be inverted and amplified by the driver circuit comprised of the second CMOS inverter and the string of serially connected inverters 29–32, thereby producing a "high" level VCCH output signal. Therefore, when the resistance of the transistor M1 is made relatively small, even when the operating voltage Vcc is at a relatively low level, e.g., Vt1, a "high" level VCCH output signal is generated. On the other hand, if the resistance of the transistor M2 is made relatively large, the voltage applied to the gate of the NMOS transistor 24 of the first CMOS inverter circuit will only be gradually increased (i.e., over a relatively longer time period) to a level sufficiently high to turn on the transistor 24, and thereby trigger the operation of the first CMOS inverter circuit to produce a "low" level output. Therefore, when the resistance of the transistor M1 is made relatively large, the operating voltage Vcc must reach a relatively high level, e.g., Vth, before a "high" level VCCH output signal can be generated.

Although only a single voltage detection/start-up circuit is shown in FIG. 6A, it should be clearly understood that the start-up circuit 100A is actually comprised of a plurality, n, of individual voltage detection/start-up circuits such as the one depicted in FIG. 6A, with each such individual voltage detection/start-up circuit being designed to generate a high output signal upon detection of the operating voltage Vcc having a level above a different threshold voltage level Vti, where i=1−n. For example, in the illustrative embodiment of the refresh timer of the present invention described above in connection with FIGS. 4, 5A, and 5B, wherein the number, n, of different operating voltages was assumed to be 2, two such individual voltage detection/start-up circuits are required, with the first one being designed to drive the output signal VCCH1 high when the level of the operating voltage Vcc exceeds the first/low threshold voltage level (i.e., when the operating voltage Vcc is at its low operating level), Vt1, and the second one being designed to drive the output signal VCCH2 high when the level of the operating voltage Vcc exceeds the second/high threshold voltage level, Vth (i.e., when the operating voltage Vcc is at its high operating level).

Figure 6C:
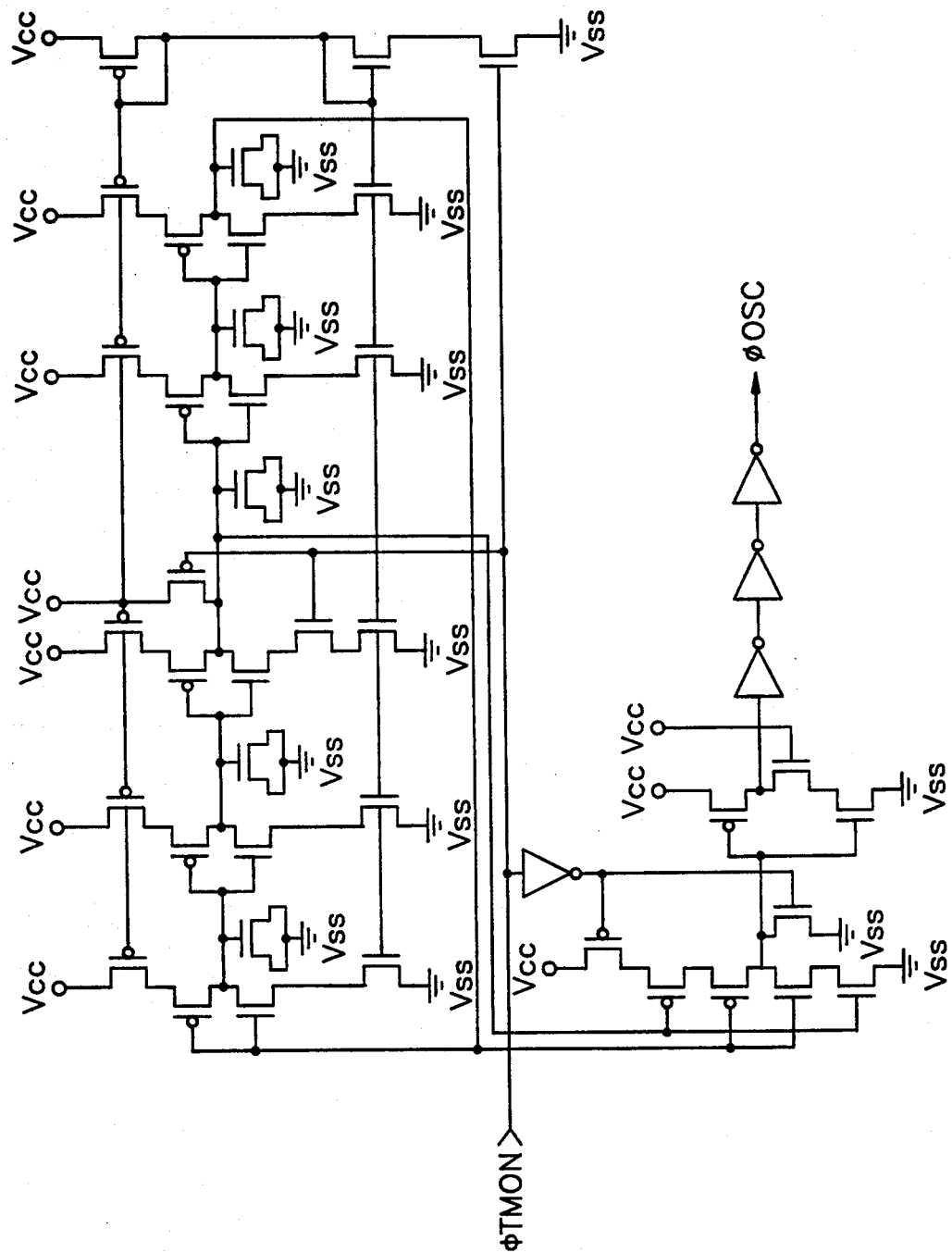
FIG. 6C is a schematic diagram of the ring oscillator of the refresh timer depicted in FIG. 3.

With reference now to FIG. 6C, there can be seen a schematic diagram of an exemplary embodiment of one of the individual ring oscillators 1−n of the ring oscillator 300A depicted in block diagram form in FIG. 3. In a preferred embodiment of the present invention, each of the individual ring oscillators 1−n of the ring oscillator 300A are of virtually identical construction, e.g., like that shown in FIG. 6C, except that each one is adapted to be triggered by a different one of the output signals $\phi$TMON1−$\phi$TMON2 generated by the control circuit 200A. Since the details of the construction and operation of the exemplary individual ring oscillator shown in FIG. 6C are well-known to those skilled in the pertinent art, it is deemed unnecessary to elaborate thereupon herein. In essence, only the one of the individual ring oscillators 1−n which receives the one of the output signals $\phi$TMON1−$\phi$TMON2 which is high, is enabled. When thusly enabled, the individual ring oscillator functions to produce at its output an oscillator clock signal $\phi$osc having a constant period. Therefore, regardless of which one of the individual oscillator circuits 1−n is enabled, the output, $\phi$osc, of the ring oscillator 300A will have the same, constant period. Consequently, regardless of the level of the operating voltage Vcc, an oscillator clock signal $\phi$osc having a constant period will be produced.

Figure 6D:
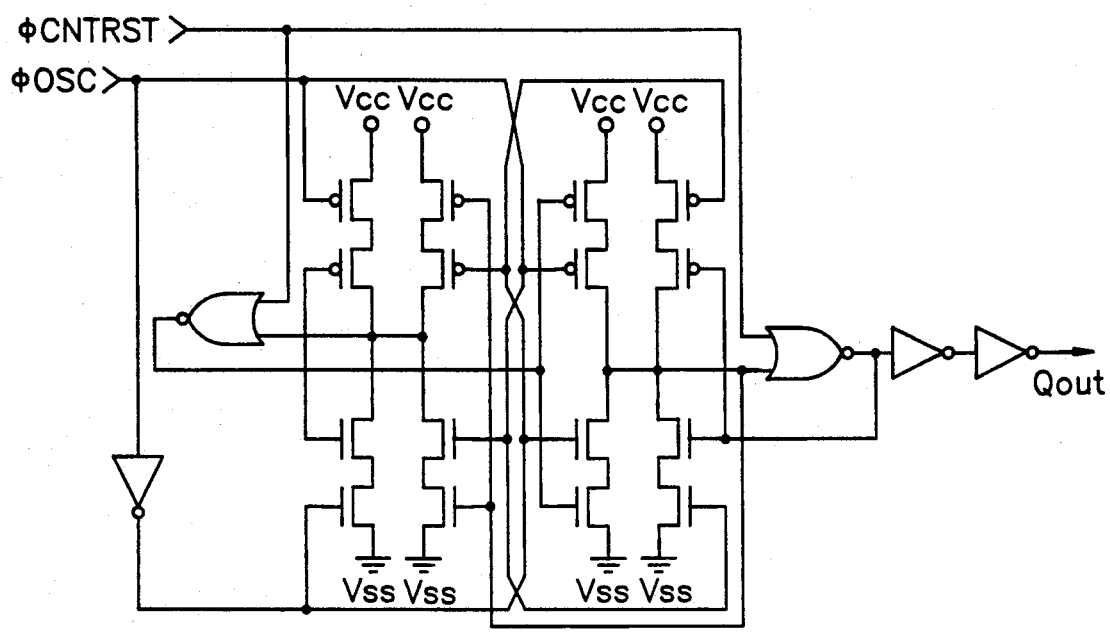
FIG. 6D is a schematic diagram of the counter stage of the refresh timer depicted in FIG. 3.
Figure 6E:
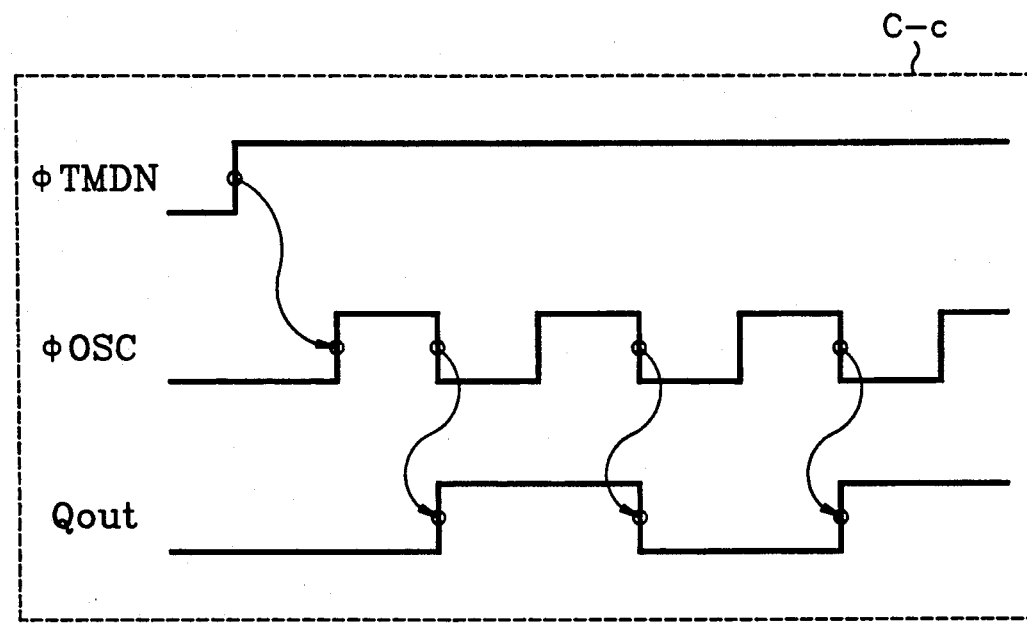
FIG. 6E is a waveform diagram of the counter stage of the refresh timer depicted in FIG. 6D.

With reference now to FIG. 6D, there can be seen a schematic diagram of an exemplary embodiment of the counter stage 400A depicted in block diagram form in FIG. 3. Since the details of construction and operation of the exemplary counter stage 400A depicted in FIG. 6D are well-known to those skilled in the pertinent art, it is deemed unnecessary to elaborate thereupon herein. In essence, the counter stage 400A functions in a well-known manner, in response to a counter reset clock signal $\phi$CNTRST which is driven high after one of the outputs $\phi$TMON1−$\phi$TMON2 of the control circuit 200A is driven high, to lengthen the pulse period of the pulse signal $\phi$osc produced by the ring oscillator 300A, to thereby produce at its output a refresh cycle time control signal Qout having the proper, constant period, e.g., twice the period of the output $\phi$osc of the ring oscillator 300A, as is illustrated in the waveform diagram depicted in the dotted block C-c of FIG. 6E. Of course, the specific implementation of the counter stage 400A will vary depending upon the specific requirements of the memory system (not shown) in which the refresh timer of the present invention is employed. In fact, in certain applications, a counter stage or other type of pulse extending/lengthening means may not be required at all.

Figure 6F:
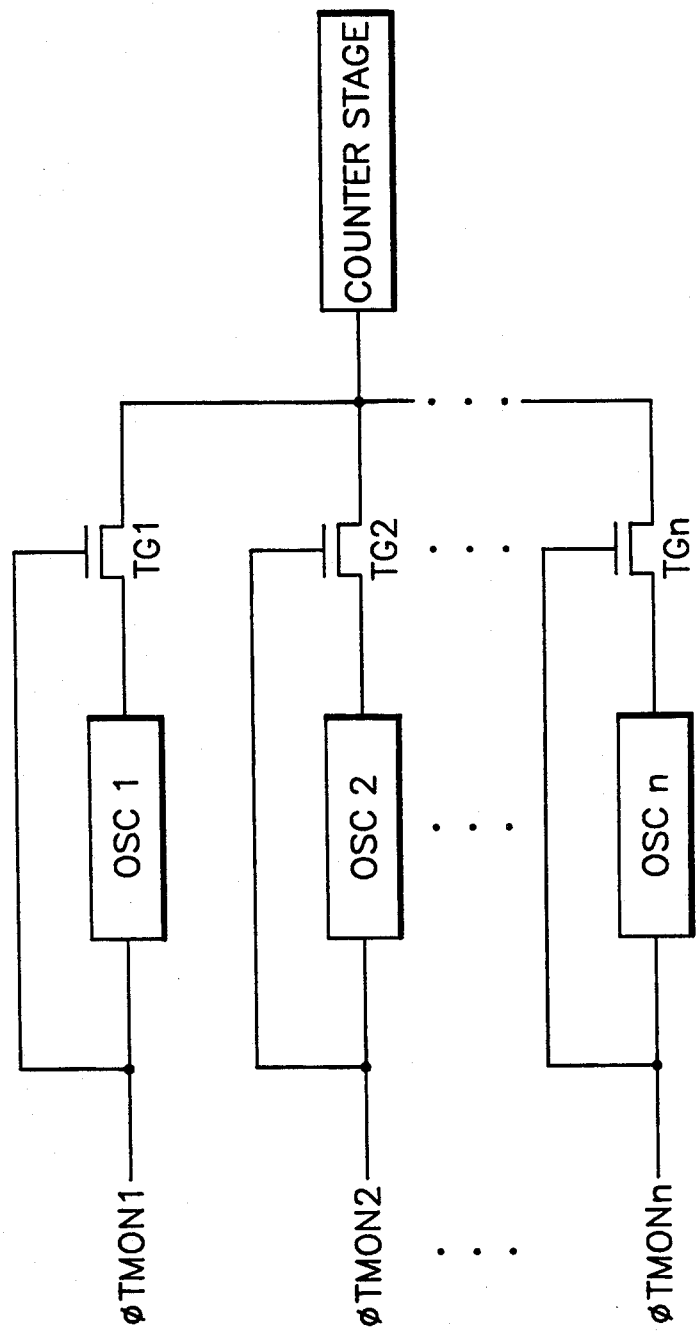
FIG. 6F is a functional block diagram illustrating a refresh timer constructed in accordance with a preferred embodiment of the interconnection between the individual ring oscillators of the present invention.

With reference now to FIG. 6F, there can be seen a preferred embodiment of the interconnection between the individual ring oscillators OSC1−OSCN of the ring oscillator 300A, and the counter stage 400A. In this embodiment, the plurality of output signals $\phi$TMON1−$\phi$TMONn of the control circuit 200A which are applied to the corresponding plurality of individual ring oscillators OSC1−OSCn, respectively, are also applied to the gates of a corresponding plurality of output transistors TG1−Tgn, respectively, which are interposed between the outputs of the individual ring oscillators OSC1-OSCN and the counter stage 400A. Therefore, as can be readily appreciated, the output signals φTMON1-OMONn of the control circuit 200A also serve to gate the outputs of the individual ring oscillators OSC1-OSCN to the counter stage 400A. In operation, only the one of the output transistors TG1-Tgn which receives, at its gate, the one of the output signals φTMON-φTMONn which is high, will be turned on, thereby enabling the output of the corresponding individual ring oscillator to be applied to the counter stage 400A. Of course, as will be readily apparent to those skilled in the pertinent art, the output transistors TG1-Tgn are an optional feature of the refresh timer of the present invention. For example, alternatively, the outputs of the individual ring oscillators OSC1-OSCn can be coupled directly to the counter stage 400A.

Figure 7:
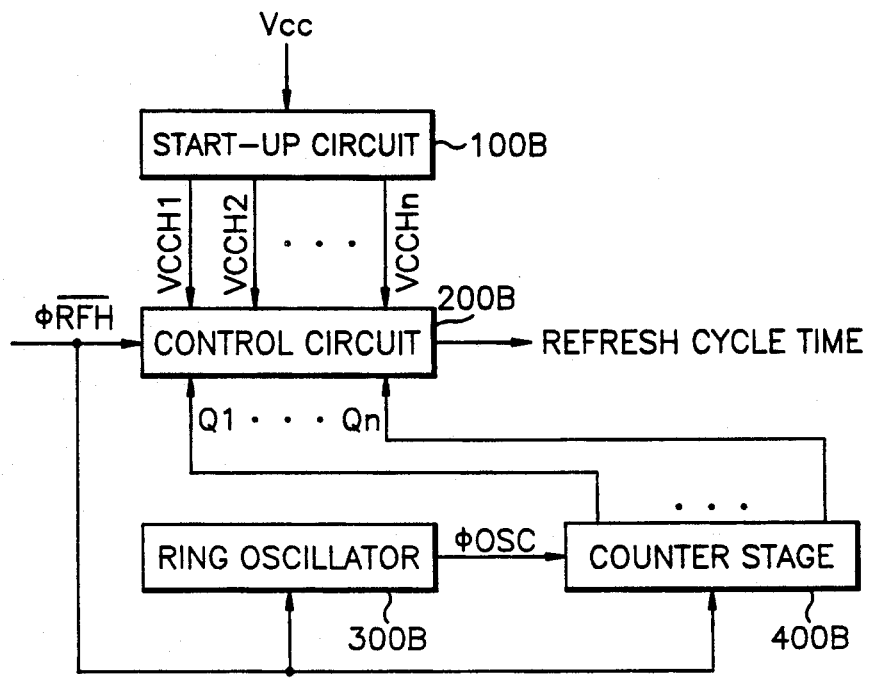
FIG. 7 is a functional block diagram of a refresh timer constructed in accordance with a second preferred embodiment of the present invention; and, FIG. 8 is a schematic diagram of the control circuit of the refresh timer depicted in FIG. 7.

With reference now to FIG. 7, there can be seen a functional block diagram of a refresh timer constructed in accordance with a second preferred embodiment of the present invention. This second preferred embodiment of the refresh timer employs the same basic circuit elements as those employed in the first preferred embodiment, but, as will become evident from the following description, some of these circuit elements are modified in order to achieve an identical result in a somewhat different manner.

With continuing reference to FIG. 7, the second preferred embodiment of the refresh circuit of the present invention includes a start-up circuit 100B, a control circuit 200B, a ring oscillator 300B, and a counter stage 400B, which cooperatively function in a manner described below to produce a refresh cycle time control signal for synchronizing the refresh operation of a DRAM or pseudo-DRAM semiconductor memory device (not shown), or the like.

Figure 8:
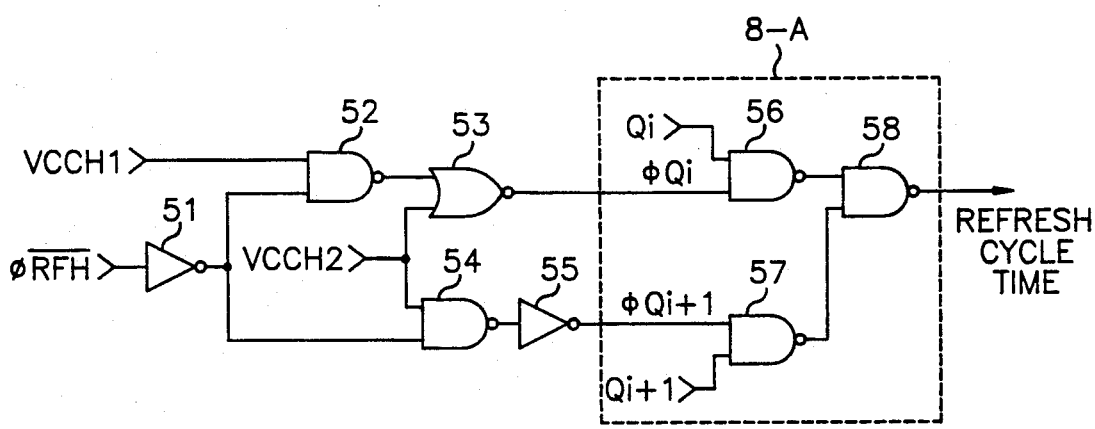

The start-up circuit 100B is identical to the start-up circuit 100A described previously in connection with the first preferred embodiment. As can be seen in FIG. 8, the control circuit 200B is identical to the control circuit 200A described previously in connection with the first preferred embodiment, except that the control circuit 200B has an additional circuit portion depicted in the dotted box 8-A. The ring oscillator 300B is comprised of only a single oscillator circuit, rather than a plurality of individual oscillator circuits, as in the first preferred embodiment. Also, the ring oscillator 300B is responsive to the refresh enable clock signal φ/RFH, rather than output signals from the control circuit, as in the first preferred embodiment. The counter stage 400B produces a plurality of output pulse signals Q1-Qn which are applied to the control circuit 200B. The control circuit 200B is responsive to the output voltage signals VCCH1-VCCHn from the start-up circuit 100B, and the output pulse signals Q1-Qn from the counter stage 400B, to produce the refresh cycle time control signal (labelled "REFRESH CYCLE TIME"). Thus, rather than the counter stage 400B producing the refresh cycle time control signal, as in the first preferred embodiment, the control circuit 200B of the second preferred embodiment produces the refresh cycle time control signal.

Figure 1:
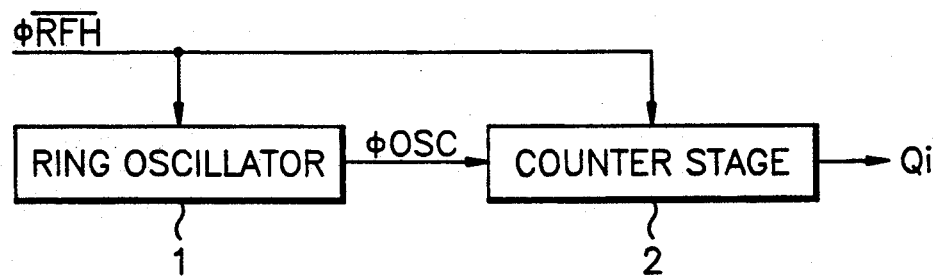
FIG. 1 is a functional block diagram of a conventional refresh timer.
Figure 2:
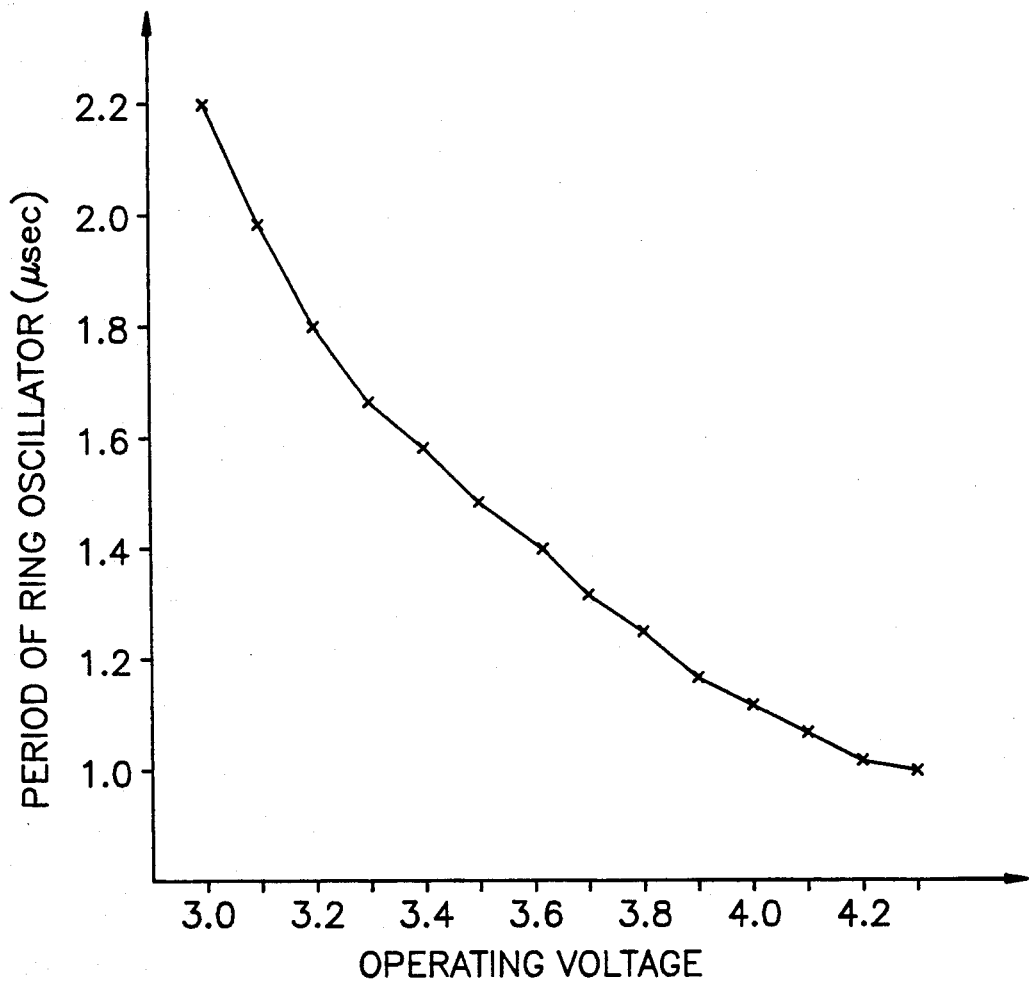
FIG. 2 is a chart plotting the period of the output of the ring oscillator of the refresh timer depicted in FIG. 1 as a function of the level of the operating voltage.

In operation, the refresh timer of the second preferred embodiment works in the following manner. The period of the output signal φosc of the ring oscillator 300B will have a period which varies as a function of the operating voltage level, as shown in FIG. 2. For example, assuming that n is selected to be 2, corresponding to high and low operating voltage levels, and further assuming that the high operating voltage level is twice the low operating voltage level, then the period of the output signal φosc of the ring oscillator 300B when the operating voltage level is low is twice the period of the output signal φosc when the operating voltage level is high. In response to the output signal φosc of the ring oscillator 300B, the counter stage 400B, which is conveniently a multi-stage counter, functions to generate a plurality of output pulse signals Q1-Qn, which are the outputs of corresponding n successive stages (not shown) of the counter stage 400B. As such, the counter stage 400B is capable of extending the length of the period of the output signal φosc of the ring oscillator 300B by variable amounts. Otherwise stated, the output pulse signals Q1-Qn of the counter stage 400B each have a different period. Under the above-stated assumptions, the output stage 400B will function to generate a first output pulse signal Q1 and a second output pulse signal Q2, with the period of the second output pulse signal Q2 being twice that of the first output pulse signal Q1.

With reference now to FIG. 8, the construction and operation of an exemplary embodiment of the control circuit 200B will now be described. In this embodiment, n is selected to be 2. As shown, the control circuit 200B includes a first NAND gate 52 which receives a first output signal VCCH1 of the first start-up circuit 100A at one of its inputs, and an inverted version of the refresh enable clock signal φ/RFH, via an inverter 51, at its other input. The control circuit 200B also includes a NOR gate 53 which receives the output of the first NAND gate 52 at one of its inputs, and a second output signal VCCH2 of the start-up circuit 100B at its other input, and, in response thereto, produces a signal φQi at its output. The control circuit 200B further includes a second NAND gate 54 which receives the inverted version of the refresh enable clock signal φ/RFH at one of its inputs, and the second output signal VCCH2 of the start-up circuit 100B at its other input. The output of the second NAND gate 54 is inverted by an inverter 55, to thereby produce a signal φQi+1 at its output.

Up to this point, the construction of the control circuit 200B of this embodiment of the present invention is the same as that of the control circuit 200A of the first embodiment of the present invention described previously. However, the control circuit 200B of this embodiment further includes the circuitry enclosed in the dotted box 8-A, which will now be described.

More particularly, the control circuit 200B further includes a third NAND gate 56 which receives the signal φQi at one of its inputs, and a first output pulse signal Qi from the counter stage 400B at its other input. The control circuit 200B also includes a fourth NAND gate 57 which receives the signal φQi+1 at one of its inputs, and a second output pulse signal Qi+1 from the counter stage 400B at its other input. Again, assuming that n is 2, the first output signal Qi from the counter stage 400B is Q1, and the second output signal Qi+1 from the counter stage 400B is Q2. Likewise, the signal φQi is φQ1 and the signal φQi+1 is φQ2.

With continuing reference to FIG. 8, if only the first output signal VCCH1 of the start-up circuit 100B is high, corresponding to the condition where the operating voltage Vcc is at its low level, then the signal φQ1 will be high, and the signal φQ2 will be low. Accordingly, the output of the third NAND gate 56 will be low whenever Q1 is high, because both inputs thereto, Q1 and φQ1, will be high during these periods. Further, the output of the fourth NAND gate 57 will be high, because one of the inputs thereto, the signal $\phi$Q2, will be low. As such, it can be appreciated that the output of the fourth NAND gate 57 will be high whenever the operating voltage is at its low level. Therefore, the output of the fifth NAND gate 58 will be high whenever Q1 is high, because when Q1 is high, the output of the third NAND gate 56, which is one of the inputs to the fifth NAND gate 58, will be low.

It will be remembered that the period of the output signal $\phi$osc of the ring oscillator 300B when the operating voltage is at its low level is twice the period of this signal when the operating voltage is at its high level. Therefore, since the output pulse signal Q1 of the counter stage 400B is selected by the control circuit 200B when the operating voltage is at its low level, the period of the output signal $\phi$osc of the ring oscillator 300B is extended by an amount which is one-half of the amount by which it would be extended if the output signal Q2 of the counter stage 400B would have been selected by the control circuit 200B. Hence, the output of the fifth NAND gate 58, which is the refresh cycle time control signal (labelled "REFRESH CYCLE TIME"), will have a constant period, regardless of whether the operating voltage is at its high level or its low level.

In this connection, when the operating voltage is at its high level, the output of the fifth NAND gate 58 will be controlled by the second output pulse signal Q2, which has a period which is twice the period of the first output pulse signal Q1. Also, when the operating voltage is at its high level, the output pulse signal $\phi$osc of the ring oscillator 300B will have a period which is one-half of the period of this signal when the operating voltage is at its low level. Thus, it can be appreciated that the output pulse signals Q1 and Q2 of the counter stage 400B are employed to equalize the period of the refresh cycle time control signal over both operating voltage levels. This can be illustrated mathematically as follows. Let the frequency of $\phi$osc be f when the operating voltage is at its high level, and 2f when the operating voltage is at its low level. Let the frequency of the first output pulse Q1 be f', and the frequency of the second output pulse Q2 be 2f'. When the operating voltage is at its low level, the refresh cycle time control signal output by the control circuit 200B is $2f \times f' = 2ff'$. When the operating voltage is at its high level, the refresh cycle time control signal output by the control circuit 200B is $f \times 2f' = 2ff'$. Therefore, the frequency of the refresh cycle time control signal is 2ff', regardless of whether the operating voltage is at its high level or its low level.

Based upon the foregoing, it should be appreciated that a refresh timer constructed in accordance with either of the above-described first or second preferred embodiments thereof overcomes the drawbacks and shortcomings of presently available refresh timers. More particularly, the period of the refresh cycle time control signal generated thereby is constant, regardless of the level of the operating voltage employed in the semiconductor memory device in which the refresh timer is utilized, thereby ensuring stable, reliable, and accurate refresh operations.

Although the present invention has been described in conjunction with two specific preferred embodiments thereof, it should be clearly understood that many variations and/or modifications of the basic inventive concepts herein taught which may appear to those skilled in the pertinent art will still fall within the spirit and scope of the present invention, as defined in the appended claims.

What is claimed is:

1. A refresh timer suitable for use in a semiconductor memory device which has a refresh mode of operation which is enabled by a refresh enable clock signal, and which utilizes an operating voltage having a plurality of different operating levels, Vi, where $i = 1 - n$, and n is an integer equal to or greater than two, the refresh timer comprising:

first circuit means responsive to said operating voltage for generating a plurality of output voltage signals OVi, where $i = 1 - n$, corresponding to said plurality of different operating voltage levels, said first circuit means including a plurality of individual voltage detection circuits, VDi, where $i = 1 - n$, corresponding to said plurality of different operating voltage levels, with each ith one of said voltage detection circuits being adapted to detect whether said operating voltage is at said corresponding ith level and to drive the corresponding ith one of said output voltage signals high when it is detected that said operating voltage is at the corresponding ith level; and, means responsive to said refresh enable clock signal and the ith one of said output voltage signals which was last driven high by said first circuit means, for generating a refresh cycle time control signal having a constant period.

2. The timer as set forth in claim 1, wherein said means responsive to said refresh enable clock signal comprises:

second circuit means responsive to said refresh enable clock signal and said plurality of output voltage signals, for generating a plurality of output control signals, OCi, where $i = 1 - n$, corresponding to said plurality of output voltage signals, said second circuit means including logic gating means for driving high only the ith one of said output control signals corresponding to the ith one of said output voltage signals which was last driven high by said first circuit means;

oscillator means including a plurality of individual oscillator circuits, ROi, where $i = 1 - n$, each of which is adapted to receive a corresponding ith one of said output control signals from said second circuit means, whereby only said oscillator circuit which receives the one of said output control signals which is in a high state is enabled, to thereby produce an oscillator clock signal, wherein regardless of which one of said individual oscillator circuits is enabled, said oscillator clock signal produced thereby will have the same, constant period; and, means for extending the length of said period of said oscillator clock signal, to thereby produce said refresh cycle time control signal.

3. The timer as set forth in claim 2, wherein said length extending means comprises a counter stage.

4. The timer as set forth in claim 2, further comprising a plurality of oscillator output gating means, TGi, where $i = 1 - n$, interconnected between the output of corresponding ones of said plurality of individual oscillator circuits, respectively, and said length extending means, each of said oscillator output gating means being adapted to receive a corresponding ith one of said output control signals from said second circuit means, said oscillator output gating means being responsive to the one of said output control signals which is in a high state, to thereby gate the output of the corresponding ith one of said individual oscillator circuits to said length extending means.

5. The timer as set forth in claim 4, wherein each of said oscillator output gating means comprises a MOS transistor having a gate which is coupled to said corresponding ith one of said output control signals from said second circuit means.

6. The timer as set forth in claim 2, wherein:
n is selected to be 2;
said operating voltage utilized by said semiconductor memory device has a first operating voltage level which is relatively low, and a second operating voltage level which is relatively high; and,
said first circuit means is responsive to said operating voltage for generating first and second output voltage signals corresponding to said first and second operating voltage levels, respectively, and includes first and second voltage detection circuits, said first voltage detection circuit being adapted to drive said first output voltage signal high when said operating voltage is above said first operating voltage level, and to drive said second output voltage signal high when said operating voltage is above said second operating voltage level.

7. The timer as set forth in claim 6, wherein said logic gating means of said second circuit means comprises:
a first inverter for inverting said refresh enable clock signal;
a first NAND gate having a first input coupled to said first output voltage signal, and a second input coupled to said inverted refresh enable clock signal;
a NOR gate having a first input coupled to the output of said first NAND gate, and a second input coupled to said second output voltage signal, wherein the output of said NOR gate is a first one of said output control signals;
a second NAND gate having a first input coupled to said second output voltage signal, and a second input coupled to said inverted refresh enable clock signal; and,
a second inverter for inverting the output of said NAND gate, wherein the output of said second inverter is a second one of said output control signals.

8. The timer as set forth in claim 2, wherein each of said individual voltage detection circuits of said first circuit means comprises:
a voltage sense stage comprised of a resistor means and a capacitor means connected in series between said operating voltage and a reference potential, with a common node intermediate said resistor means and said capacitor means serving as an output node of said voltage sense stage;
an inverter circuit having an input node connected to said output node of said voltage sense stage, and an output node which is inverted with respect to said input node;
a driver circuit having an input node connected to said output node of said inverter circuit, and an output node; and,
wherein said driver circuit is operable to invert and amplify a signal appearing at said output node of said inverter circuit, to thereby produce a corresponding ith one of said output voltage signals at said output node of said driver circuit.

9. The timer as set forth in claim 8, wherein said resistor means of said voltage sense stage of each one of said individual voltage detection circuits of said first circuit means has a resistance value which is different.

10. The timer as set forth in claim 8, wherein said resistor means and said capacitor means of said voltage sense stage of each one of said individual voltage detection circuits of said first circuit means exhibits a different RC time constant.

11. The timer as set forth in claim 10, further comprising means for preventing floating of signals appearing at said output nodes of said voltage sense stage, said inverter circuit, and said drive circuit, respectively.

12. The timer as set forth in claim 1, wherein a source of said operating voltage comprises a battery.

13. The timer as set forth in claim 1, wherein said semiconductor memory device comprises a DRAM.

14. The timer as set forth in claim 1, wherein said means responsive to said refresh enable clock signal comprises:
an oscillator responsive to said refresh enable clock signal for generating an oscillator output signal having a period which is inversely proportional to the level of said operating voltage by a predetermined ratio;
pulse extending means responsive to said refresh enable clock signal and said oscillator output signal f or generating a plurality of output pulse signals OPi, where i−1−n, wherein each successive output pulse signal has a period which is greater than the period of the preceding one of said output pulse signals by said predetermined ratio; and,
second circuit means responsive to said refresh enable clock signal and said plurality of output pulse signals Opi to generate said refresh cycle time control signal having said constant period.

15. The timer as set forth in claim 14, wherein said pulse extending means comprises a multi-stage counter.

16. The timer as set forth in claim 14, wherein:
n is selected to be 2;
said operating voltage utilized by said semiconductor memory device has a first operating voltage level which is relatively low, and a second operating voltage which is relatively high;
said first circuit means is responsive to said operating voltage for generating first and second output voltage signals corresponding to said first and second operating voltage levels, respectively, and includes first and second voltage detection circuits, said first voltage detection circuit being adapted to drive said first output voltage signal high when said operating voltage is above said first operating voltage level, and to drive said second output voltage signal high when said operating voltage is above said second operating voltage level; and,
said pulse extending means is responsive to said refresh enable clock signal and said oscillator output signal to generate first and second output pulse signals.

17. The timer as set forth in claim 16, wherein said second circuit means comprises:
a first inverter for inverting said refresh enable clock signal;
a first NAND gate having a first input coupled to said first output voltage signal, and a second input coupled to said inverted refresh enable clock signal;
input coupled to the a NOR gate having a first output of said first NAND gate, and a second input coupled to said second output voltage signal;

a second NAND gate having a first input coupled to said second output voltage signal, and a second input coupled to said inverted refresh enable clock signal;

a second inverter for inverting the output of said second NAND gate;

a third NAND gate having a first input coupled to the output of said NOR gate, and a second input coupled to said first output pulse signal from said pulse extending means;

a fourth NAND gate having a first input coupled to the output of said second inverter, and a second input coupled to said second output pulse signal from said pulse extending means; and, a fifth NAND gate having a first input coupled to the output of said third NAND gate, and a second input coupled to the output of said fourth NAND gate, wherein the output of said fifth NAND gate is said refresh cycle time control signal having said constant period.

18. The timer as set forth in claim 17, wherein each of said individual voltage detection circuits of said first circuit means comprises:

a voltage sense stage comprised of a resistor means and a capacitor means connected in series between said operating voltage and a reference potential, with a common node intermediate said resistor means and said capacitor means serving as an output node of said voltage sense stage;

an inverter circuit having an input node connected to said output node of said voltage sense stage, and an output node which is inverted with respect to said input node;

a driver circuit having an input node connected to said output node of said inverter circuit, and an output node; and, wherein said driver circuit is operable to invert and amplify a signal appearing at said output node of said inverter circuit, to thereby produce a corresponding ith one of said output voltage signal at said output node of said driver circuit.

19. The timer as set forth in claim 18, wherein said resistor means and said capacitor means of said voltage sense stage of each one of said individual voltage detection circuits of said first circuit means exhibits a different RC time constant.

20. The timer as set forth in claim 19, further comprising means for preventing floating of signals appearing at said output nodes of said voltage sense stage, said inverter circuit, and said drive circuit, respectively.

* * * * *